US007449980B2

(12) United States Patent
Bates

(10) Patent No.: US 7,449,980 B2
(45) Date of Patent: Nov. 11, 2008

(54) DISCRETE VOLTAGE TUNABLE RESONATOR MADE OF DIELECTRIC MATERIAL

(75) Inventor: David Allen Bates, Fayetteville, NY (US)

(73) Assignee: Dielectric Laboratories, Inc., Cazenovia, NY (US)

( * ) Notice: Subject to any disclaimer, the term of this patent is extended or adjusted under 35 U.S.C. 154(b) by 10 days.

(21) Appl. No.: 11/720,352

(22) PCT Filed: Feb. 10, 2006

(86) PCT No.: PCT/US2006/004667

§ 371 (c)(1), (2), (4) Date: May 29, 2007

(87) PCT Pub. No.: WO2006/088728

PCT Pub. Date: Aug. 24, 2006

(65) Prior Publication Data

US 2008/0211601 A1 Sep. 4, 2008

Related U.S. Application Data

(60) Provisional application No. 60/653,287, filed on Feb. 16, 2005.

(51) Int. Cl.
*H03H 9/54* (2006.01)
*H01P 1/20* (2006.01)
*H01P 7/10* (2006.01)

(52) U.S. Cl. ....................................... 333/202; 333/235

(58) Field of Classification Search ................. 333/235, 333/202, 219, 219.1, 188
See application file for complete search history.

(56) References Cited

U.S. PATENT DOCUMENTS 6,683,516 B2 1/2004 Chiu et al.

*Primary Examiner*—Stephen E Jones
(74) *Attorney, Agent, or Firm*—Burr & Brown

(57) ABSTRACT

A voltage tunable resonator is provided, including a dielectric base made of a dielectric material having at least one of a voltage dependent dielectric constant and piezoelectric characteristics. A metal contact having a predetermined area is provided on an outer surface of the dielectric base at a predetermined location to provide a predetermined loaded Q for the resonator, and a metal ground coating is provided on the remaining exposed surfaces of the dielectric base, and an isolation region having a sufficient area to prevent significant coupling between the metal contact and the metal ground coating. A control voltage applied between the metal contact and the metal ground coating provides at least one of (i) a variable electric field to control the dielectric constant and a resonant frequency of the resonator and (ii) a piezoelectric response causing a dimensional change in the resonator to control the resonant frequency of the resonator.

17 Claims, 6 Drawing Sheets

DISCRETE VOLTAGE TUNABLE RESONATOR MADE OF DIELECTRIC MATERIAL

FIELD OF THE INVENTION

The present invention relates to a discrete voltage tunable resonator made of a dielectric material, and in particular to a discrete voltage tunable resonator containing a single layer of ceramic dielectric material having a dielectric constant which is voltage dependant and that is covered with a metal ground coating and a metal contact in contact with the dielectric, but electrically isolated from the metal ground coating.

BACKGROUND OF THE INVENTION

Electronic resonators are used in a variety of electronic circuits to perform a variety of functions. Depending upon the structure and material of the resonator, when an AC signal is applied to the resonator over a broad frequency range the resonator will resonate at specific resonant frequencies. This characteristic allows the resonator to be used, for example, in an electronic filter that is designed to pass only frequencies in a preselected frequency range, or to attenuate specific frequencies. Many applications would be ideally served by resonators and filters which are electrically tunable, thus minimizing the added noise and interference associated with their wider bandwidth fixed tuned counterparts.

Resonators are also used in high frequency applications, such as optical and wireless communication systems which operate in the GHz range. In these types of applications, resonators are used, for example, to stabilize the frequency of oscillators in transmitters and receivers. These types of resonators must exhibit high Q values in order to provide the necessary oscillator frequency stability and spectral purity, and also maintain low phase noise. Many oscillators used in communications systems employ a Voltage Controlled Oscillator (VCO), which is electronically tuned to an exact frequency or set of exact frequencies (or channels), by means of a voltage variable reactance (typically a varactor diode) coupled to a fixed frequency resonator. A control voltage applied to the voltage variable reactance tunes the resonant frequency of the resonator, and consequently tunes the oscillator frequency. This voltage tunability of frequency enables compensation for the effects of manufacturing tolerance, temperature, aging and other environmental factors affecting the frequency of oscillation. At microwave frequencies, gallium arsenide varactor diodes are normally employed in this application because these have a relatively high Q. Their Q, however, is typically less than 50 at 10 GHz, which is still low compared to the available Q of fixed frequency resonators. As a result, the performance of oscillators and filters utilizing electronic tuning tend to exhibit higher noise and losses compared to their fixed frequency counterparts.

While several types of high Q fixed frequency resonators known in the art can be used in high Q applications, including, for example, cavity resonators, coaxial resonators, transmission line resonators and dielectric resonators, voltage tunable high Q resonators have not heretofore been known. In view of the above, it would be desirable to provide a voltage tunable high Q resonator that can be designed to resonate at a variety of specific resonant frequencies while having a simple structure and which is inexpensive to mass produce using proven materials (e.g., ceramics) and proven microelectronic techniques (e.g., lithography).

SUMMARY OF THE INVENTION

It is an object of the present invention to provide a discrete, voltage tunable high Q resonator that can be designed to resonate at a variety of specific resonant frequencies which can be adjusted by applying a control voltage, which has a simple structure and which is inexpensive to mass produce.

According to one embodiment of the present invention, a discrete voltage tunable resonator is provided that includes a dielectric base made of a dielectric material having at least one of (i) a voltage dependent dielectric constant, that is, a dielectric constant that can be varied by an applied electric field and (ii) piezoelectric characteristics, that is, a piezoelectric response upon the application of an electric field that causes a dimensional change in the dielectric base. The voltage tunable resonator has a width, a length greater than or equal to the width, a thickness and opposed major surfaces. A metal contact is formed on an outer surface of the dielectric base, and a metal ground coating is formed on the remaining exposed surfaces of the dielectric base with the exception of an isolation region around the metal contact. A control voltage applied between the isolated metal contact and the ground metal contact provides at least one of (i) a variable electric field to control the dielectric constant and the resonant frequency of the resonator and (ii) a piezoelectric response changing the dimensions of the resonator to control the resonant frequency of the device.

Preferably, the isolation region has an area sufficient to prevent significant coupling between the metal contact and the metal ground coating. In addition, the metal contact preferably has a predetermined area and is positioned at a predetermined location on the base to provide a predetermined loaded Q, input impedance, and tuning voltage coefficient of frequency for the resonator.

The voltage variable dielectric constant of the material used for the base, and the width and length of the dielectric base, are selected such that the resonator resonates at least at one predetermined voltage controlled resonant frequency range in the GHz range. While any dielectric material with an appropriate electric field dependant dielectric constant could be used, rigid materials with low thermal coefficients of dimensional expansion and a low temperature coefficient of dielectric constant are preferred, such that the resonant frequency of the resonator has a low temperature coefficient overall.

Materials having a low dielectric loss tangent of less than 0.0005 are preferred in order to minimize degradation of resonator Q. The dielectric material preferably has a high insulation resistance, preferably greater than $10^8$ ohms, between the isolated metal contact and ground to minimize DC and RF loss currents. Ceramic or crystalline dielectric materials are preferred for the dielectric base, and crystalline materials such as quartz and lithium niobate are particularly preferred materials in view of their stability of dielectric constant and low mechanical expansion with temperature variation.

The crystal plane orientation relative to the resonator plane orientation is a design parameter that influences the resonant frequency stability with temperature as well as the voltage coefficient of frequency, and sensitivity to microphonic modulation of frequency in the case of piezoelectric materials resulting from tensor material parameters. These materials allow the nominal resonant frequency of the resonator to be controlled simply by selecting a material with a predetermined effective dielectric constant range, and then forming the base to have a selected width and length.

In addition, conventional microelectronic fabrication techniques can be employed to control the size and location of the metal contact to thus control the loaded Q and input impedance for the voltage tunable dielectric resonator. Still further, since the metal ground coating shields the electromagnetic energy within the dielectric base, it is unnecessary to provide a separate housing to shield the resonator. As a result of all of the above, the resonator of the present invention can be manufactured to exhibit a wide range of voltage tunable resonant frequencies, with higher associated Q values compared to prior art solution consisting of a fixed frequency resonator and varactor diode combination, and at a reduced manufacturing cost compared to the prior art solution.

The discrete resonator of the present invention can easily operate at resonant frequencies in the range of 1 GHz to 80 GHz and can exhibit loaded Q values in the range of 50 to over 2000. This enables the resonator to be used in a wide variety of applications. In addition, due to its discrete structure and controllable Q, the resonator is particularly suitable for stabilizing oscillator frequencies in communication or radar systems.

BRIEF DESCRIPTION OF THE DRAWINGS

For a better understanding of the nature and objects of the invention, reference should be made to the following detailed description of a preferred mode of practicing the invention, read in connection with the accompanying drawings, in which.

DETAILED DESCRIPTION OF THE INVENTION

Figure 1:
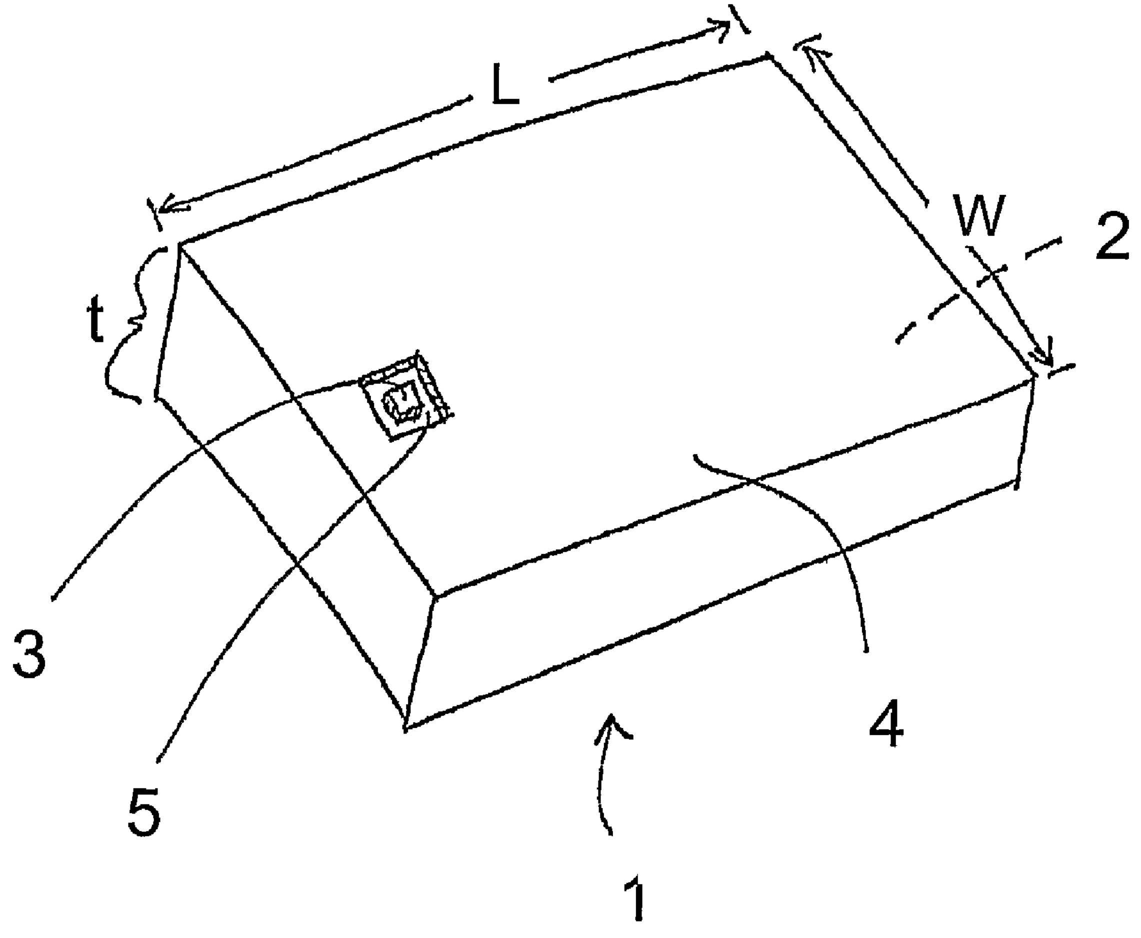
FIG. 1 is a perspective view of a voltage tunable dielectric resonator according to one embodiment of the present invention.
Figure 2:
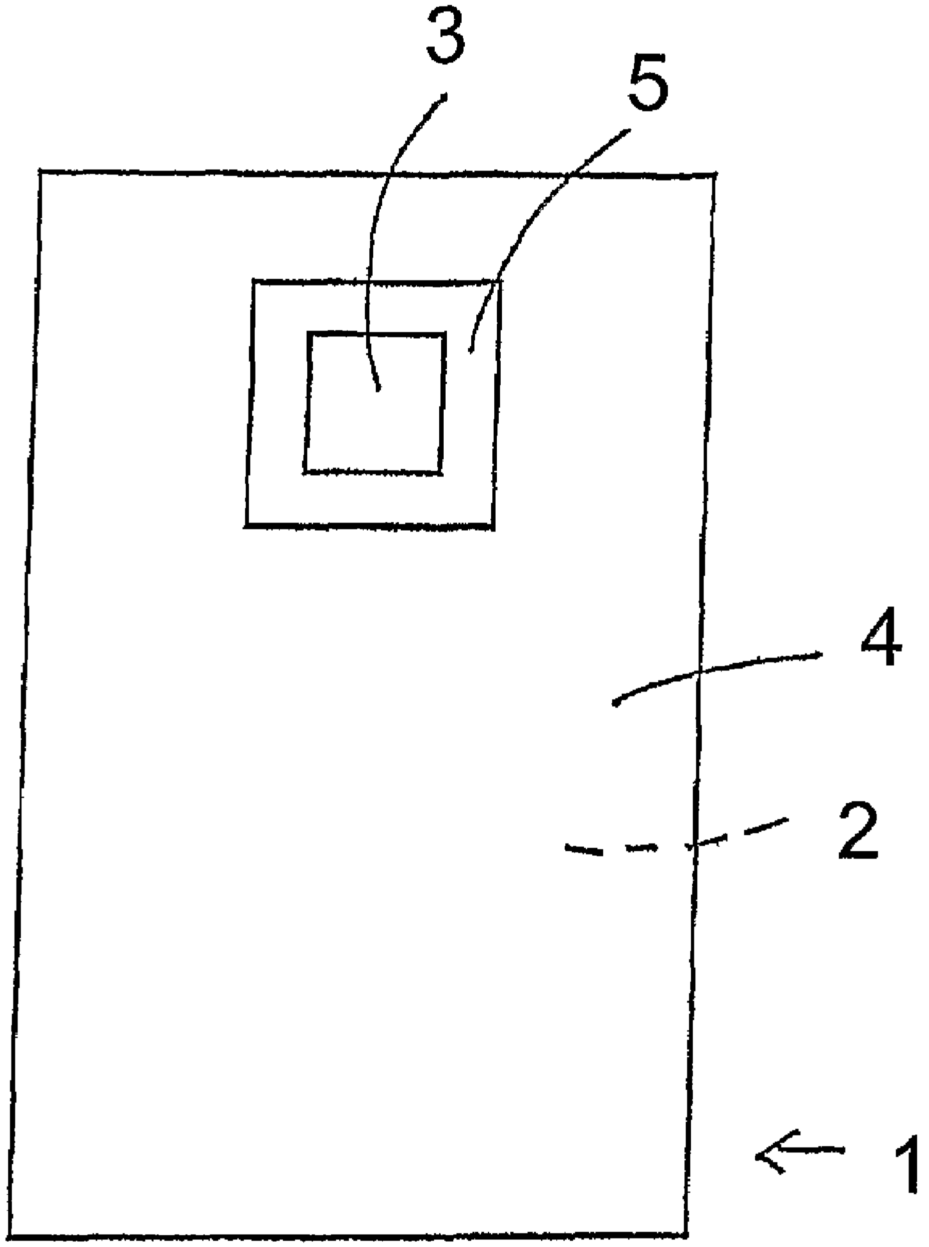
FIG. 2 is a plan view of the upper surface of the voltage tunable resonator shown in FIG. 1.

FIGS. 1 and 2 show a voltage tunable dielectric resonator 1 according to one embodiment of the present invention. The resonator 1 includes a dielectric base 2 that has a width (W), a length (L) that is greater than or equal to the width, a thickness (t) and two, opposed major surfaces. The opposed major surfaces cannot be seen in FIGS. 1 and 2, because substantially the entire outer surface of the dielectric base is covered by a metal ground coating 4, as discussed below in more detail. In addition, it should be understood that "W," "L" and "t" in FIG. 1 designate the width, length, and thickness of the underlying dielectric base 2 that is covered by the metal ground coating 4.

A metal contact 3 is formed on one of the major surfaces of the dielectric base 2, and is isolated from the metal ground coating 4 by an isolation region 5. The size of the isolation region 5 is selected to be consistent with desired input impedance between the metal contact 3 and the metal ground coating 4. For example, for a dielectric base 2 is fabricated form crystalline quartz, having dimensions on the order of 0.4 inches (W)×0.4 inches (L), and intended to operate at around 10 GHz, the isolation region 5 should be about 0.01 inches wide.

While the metal material used to form the metal contact 3 and metal ground coating 4 is not particularly limited, gold, copper and silver are examples of metals that could be used. Metals with high electrical conductivity are desirable for high Q. Superconductor surface metals can be employed to further enhance Q.

The thickness of the metal contact 3 and metal ground coating 4 is also not particularly limited, but should be at least three "skin depths" thick at the operating frequency for high Q. In the context of a 10 GHz resonator using gold or copper metal, for example, the metal contact 3 and metal ground coating 4 should be about 100 micro-inches thick. As the frequency of the device increases, the thickness of metal necessary to enable optimum Q of the device can be decreased.

The dielectric base 2 can be made of any dielectric material that has a dielectric constant that does not change significantly with temperature and that is electric field dependent. Further, the dielectric can also exhibit piezoelectric characteristics whereby the applied voltage produces a dimensional change of the resonator. It should be noted that these effects can be used independently or in combination to produce the desired voltage tuning of the resonant frequency. In addition to the above, the dielectric material must also have a predictable dielectric constant and a low loss tangent. If the voltage tunable dielectric resonator is to operate in the GHZ range, the dielectric constant of the material should typically be less than 100 for temperature stability, and the loss tangent should be less than 0.005, commensurate with the desired resonator Q. Some examples of suitable dielectric materials include, but are not limited to, crystalline quartz, lithium niobate and strontium titanate compositions.

The resonator can be designed to resonate at a variety of predetermined resonant frequencies by using a material that has a dielectric constant of less than 100 and by carefully selecting the width and length of the dielectric base 2. While the resonant frequency would be determined based on the particular application for the resonator, in the context of a resonator that will be used to stabilize the frequency of an oscillator in a telecommunications system, the resonant frequency would be on the order of 1 to 45 GHz. The resonator design of the present invention enables the manufacture of resonators that resonate at any frequency within this entire range simply by changing the length/width and/or dielectric constant of the dielectric base.

In the resonator shown in FIG. 1, the length (L) of the dielectric base 2 is greater than the width (W) thereof. It is preferred that W/L range from 0.6 to 1.0. The largest separation between resonant frequencies and maximum Q is realized for W/L=1.0. The lowest frequency resonant mode of this structure is the $TE_{101}$ mode, which results in the maximum electric field intensity within the dielectric base 2 in the two-dimensional center with respect to one of the major surfaces (e.g., the upper surface) of the dielectric base 2. In this way, the coupling between the metal contact 3 and the electromagnetic energy within the dielectric base 2 can be controlled by positioning the metal contact at selected locations on the dielectric base 2.

For example, the coupling between metal contact 3 and the electromagnetic energy within the dielectric base 2 would be maximized at the two-dimensional center of the upper surface of the dielectric base 2. In order to increase the loaded Q that the external circuit experiences when connected to the resonator, however, it is necessary to reduce the coupling between the metal contact 3 and the electromagnetic energy. Accordingly, the metal contact 3 can be moved away from the geometric center of the dielectric base 2 to reduce coupling. In the device shown in FIGS. 1 and 2, the contact 3 is positioned along a longitudinal centerline (LCL) of the resonator, but toward one of the opposed ends of the resonator. The coupling is reduced significantly in this manner.

Figure 3:
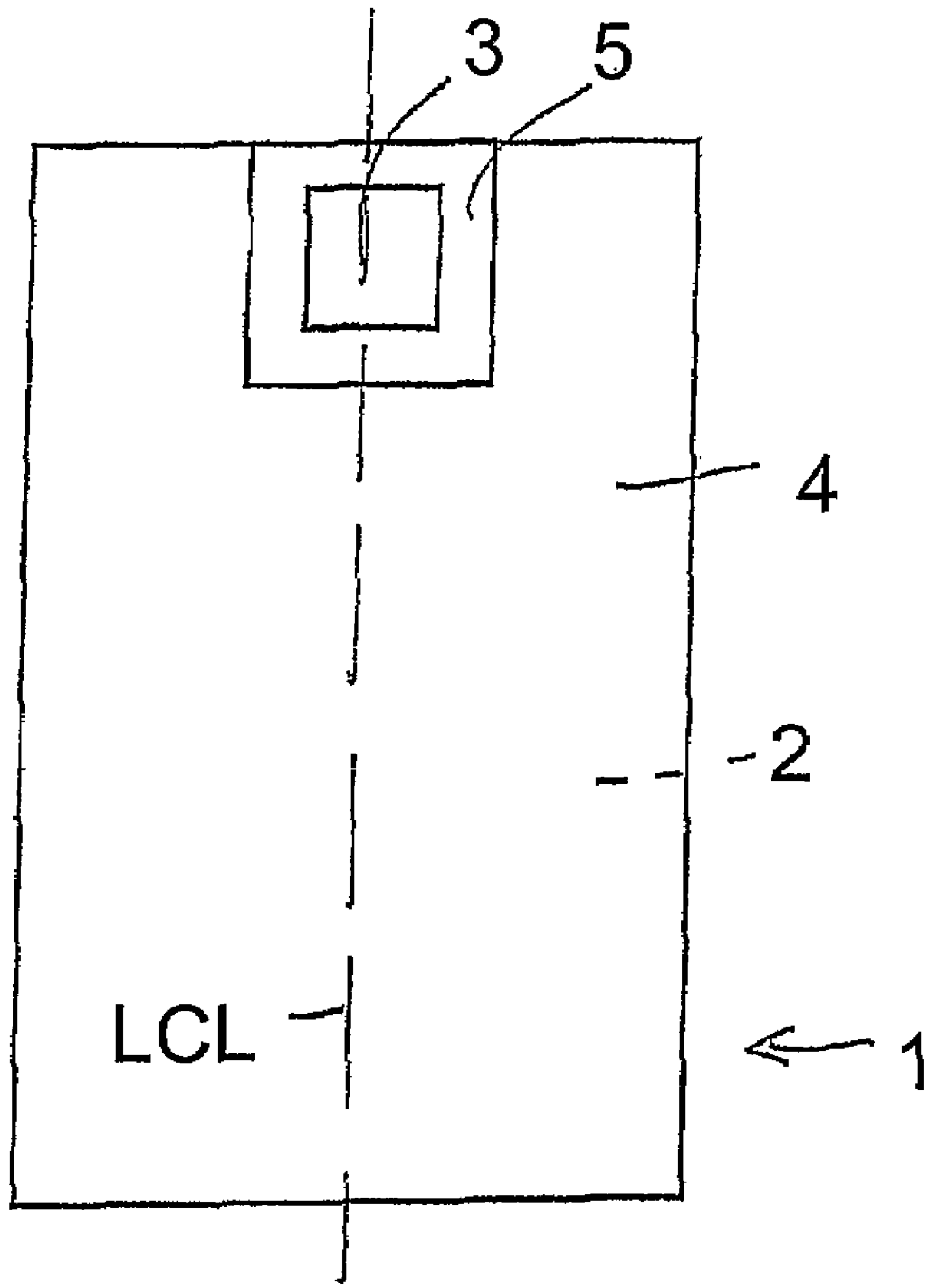
FIG. 3 is a plan view of the upper surface of a voltage tunable resonator according to another embodiment of the present invention.

FIG. 3 is a plan view showing another embodiment of a voltage tunable dielectric resonator according to the present invention. In this embodiment, the metal contact 3 is positioned closer to the longitudinal end of the resonator, but centered on the LCL of the resonator. This arrangement further reduces the coupling between the metal contact 3 and the electromagnetic energy within the dielectric base 2.

Figure 4:
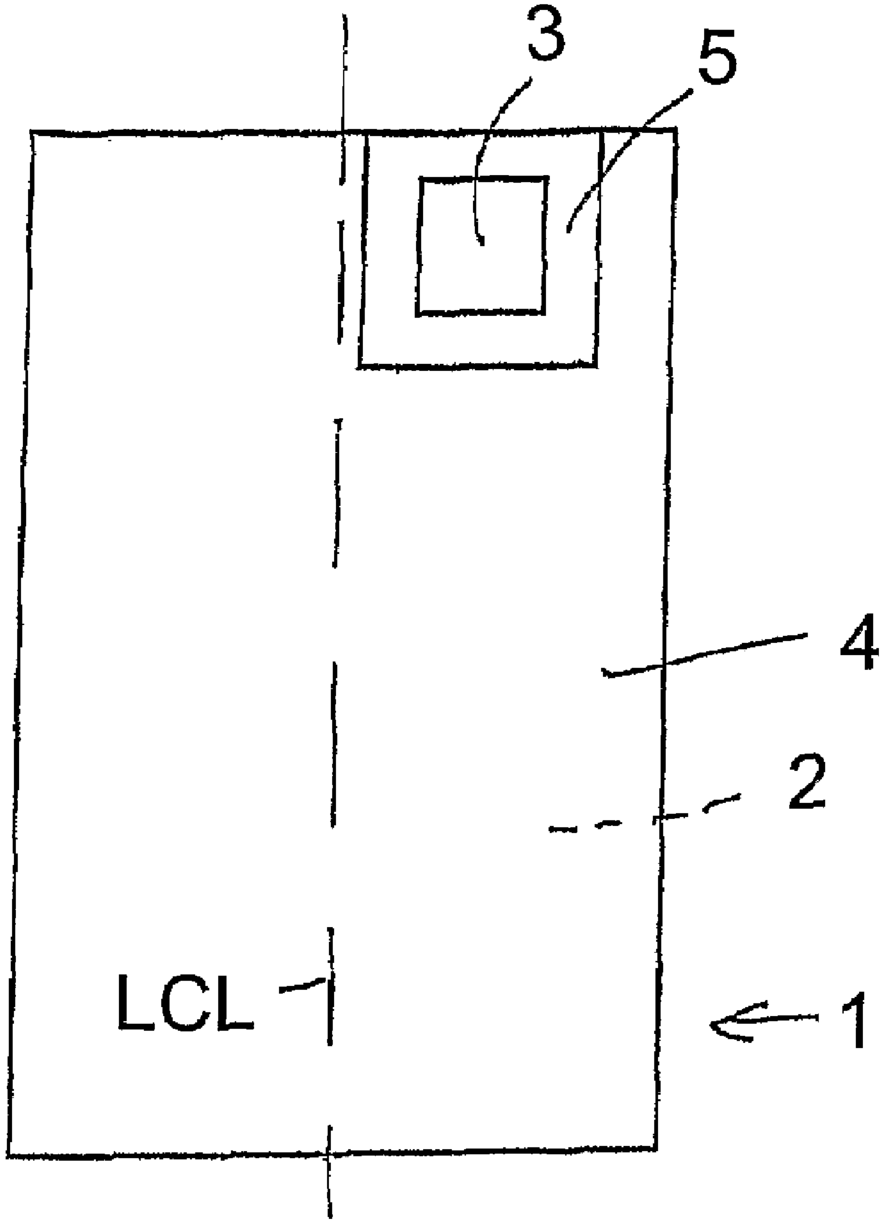
FIG. 4 is a plan view of the upper surface of a voltage tunable resonator according to another embodiment of the present invention.

FIG. 4 is a plan view showing another embodiment of a voltage tunable dielectric resonator according to the present invention, wherein the metal contact 3 is positioned proximate a longitudinal end of the resonator, but also offset with respect to the LCL of the resonator. The depicted geometry of the dielectric base 2 will focus the electromagnetic energy not only in the two-dimensional center of the upper surface of the dielectric base 2, but also along the longitudinal centerline of the dielectric base 2. The embodiment shown in FIG. 4 further reduces the coupling between the metal contact 3 and the electromagnetic energy within the dielectric base 2 by positioning the metal contact 3 not only proximate an end of the resonator, but also offset with respect to the longitudinal centerline of the resonator.

As explained above, in high frequency applications, especially in the GHz range, it is necessary for the resonator to exhibit a high Q of at least 100. In many voltage controlled oscillator (VCO) applications, the resonator according to the present invention enables the use of higher loaded resonator Qs since the resonator itself is tunable. This, in turn, provides VCOs with lower phase noise and at lower cost than the prior art. This electronic tunability also allows a group of oscillators to be adjusted to an exact frequency within a prescribed frequency range to compensate for oscillator/resonator manufacturing tolerance as well as the effects of the operating environment, such as temperature and supply voltage.

The loaded Q of the resonator is defined, in large part, by the degree of coupling between the metal contact 3 and the electromagnetic energy within the dielectric base 2. Thus, the amount of coupling can be changed by changing the size of the metal contact 3 and by changing the position of the metal contact with respect to those areas within the dielectric base 2 where the electromagnetic energy is greatest. Again, as explained above with respect to FIGS. 1-4, in the design of the present resonator the electromagnetic energy is greatest in the two-dimensional center of the upper surface of the dielectric base 2, as well as along the LCL thereof. By selecting the position of the metal contact 3 with respect to these areas of maximum field strength, the coupling can be controlled and thus the Q of the overall device can be accurately controlled.

In the context of the present invention, the Q of the resonator is particularly easy to control because the size and position of the metal contact 3 are established using standard lithographic techniques. As such, any given resonator can be formed to exhibit a very specific Q, and thus control the loaded Q experienced by the external circuit. In addition, the use of lithographic techniques also allows for precise control over the size of the isolation region 5 to dictate the input impedance of the device, which is also desirable when implementing the resonator in different external circuits.

The resonator in accordance with the present invention provides significant advantages over the resonators currently available. For example, the resonator, as a single discrete unit, can provide a relatively high loaded Q that has heretofore been available only with the more complicated (and thus more expensive) resonators discussed above. Secondly, the same basic design can be implemented across a wide variety of applications simply by changing the length/width and/or dielectric constant of the dielectric base. The thickness of the dielectric base can be adjusted over a range commensurate with fabrication methods and desired unloaded resonator Q. The Q increases with thickness up to a threshold where the resonator supports the $TE_{111}$ mode as well as the $TE_{101}$ mode (the lowest frequency mode). In addition, the use of lithographic techniques to control the position and size of the metal contact provides wide latitude in controlling the loaded Q and tuning range of the resonator to thus satisfy a variety of potential circuit requirements.

The resonator of the present invention has other advantages over the prior art. For example, if the footprint on the circuit board is size limited the dielectric constant of the material used to form the dielectric base 2 could be easily changed to achieve the desired resonant frequency. In addition, the thickness of the dielectric base 2 could also be varied to contribute to greater control of the Q of the resonator.

Another advantage of the resonator according to the present invention is that it is self-shielding. Specifically, since the entire outer surface of the dielectric base 2 is covered by the metal ground coating 4, with the exception of the metal contact 3 and isolation region 5, the electromagnetic energy within the resonator is confined by the metal coating 4. Accordingly, unlike prior art resonators, it is not necessary to provide a housing around the resonator to prevent interference by or with other components on the circuit board on which the resonator will be used.

Figure 5:
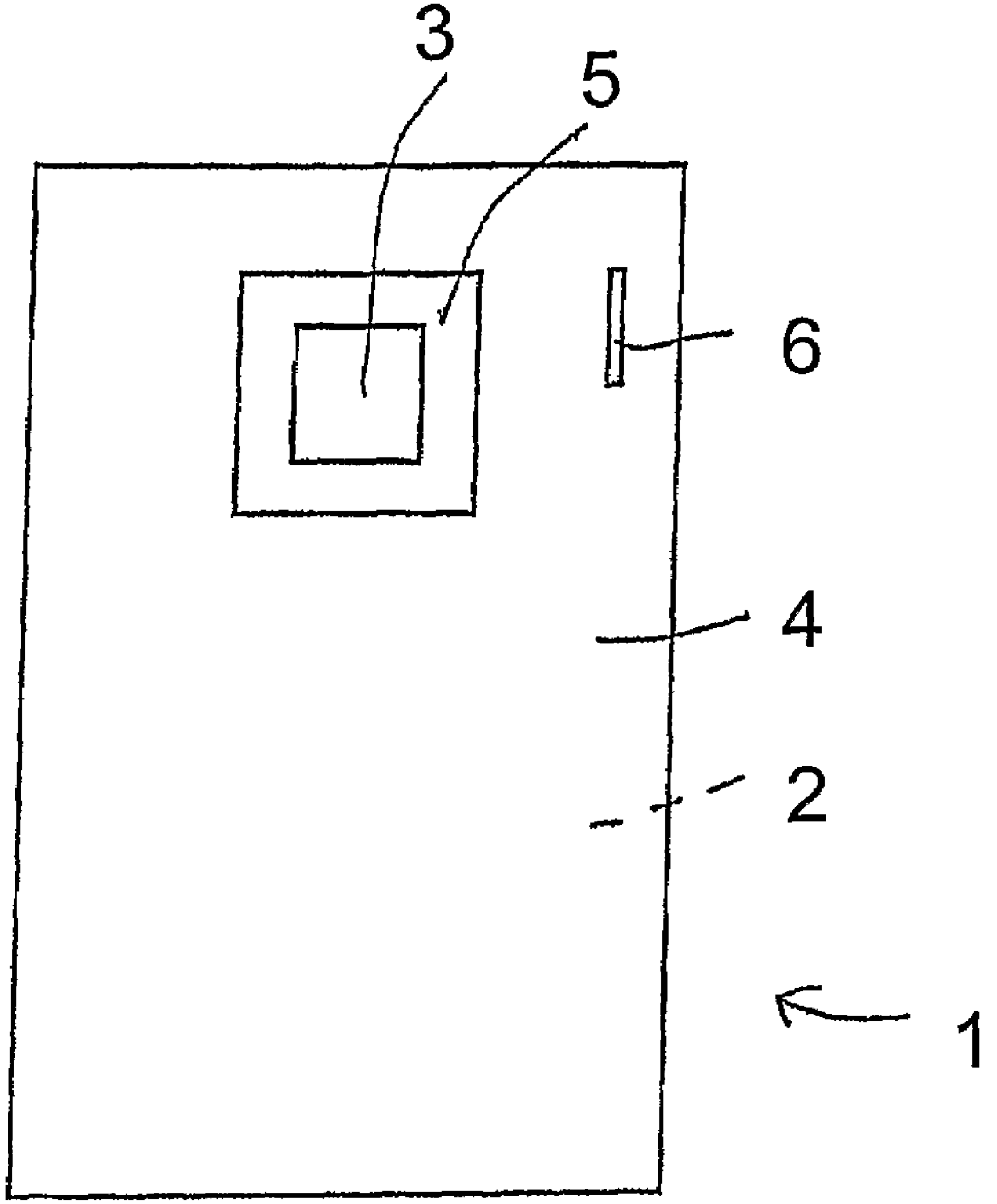
FIG. 5 is a plan view of a voltage tunable dielectric resonator as shown in FIG. 1, with part of the metal ground coating removed to adjust the resonant frequency of the resonator.

FIG. 5 is a plan view showing a voltage tunable dielectric resonator according to another embodiment of the present invention. This resonator is essentially identical to the resonator shown in FIGS. 1 and 2, except that a slot 6 has been formed through the metal ground coating 4. By removing this portion of the metal ground coating 4, the resonant frequency of the resonator can be adjusted after the primary manufacturing steps have been completed. For example, thousands of resonators could be manufactured in an identical manner to produce resonators such as shown in FIG. 1, and then specific resonators could be processed further (to form slot 6) to tune those resonators to a resonant frequency other than the resonant frequency at which the resonator shown in FIG. 1 would operate. This provides further latitude of device design, and additional cost savings in mass production.

Figure 6:
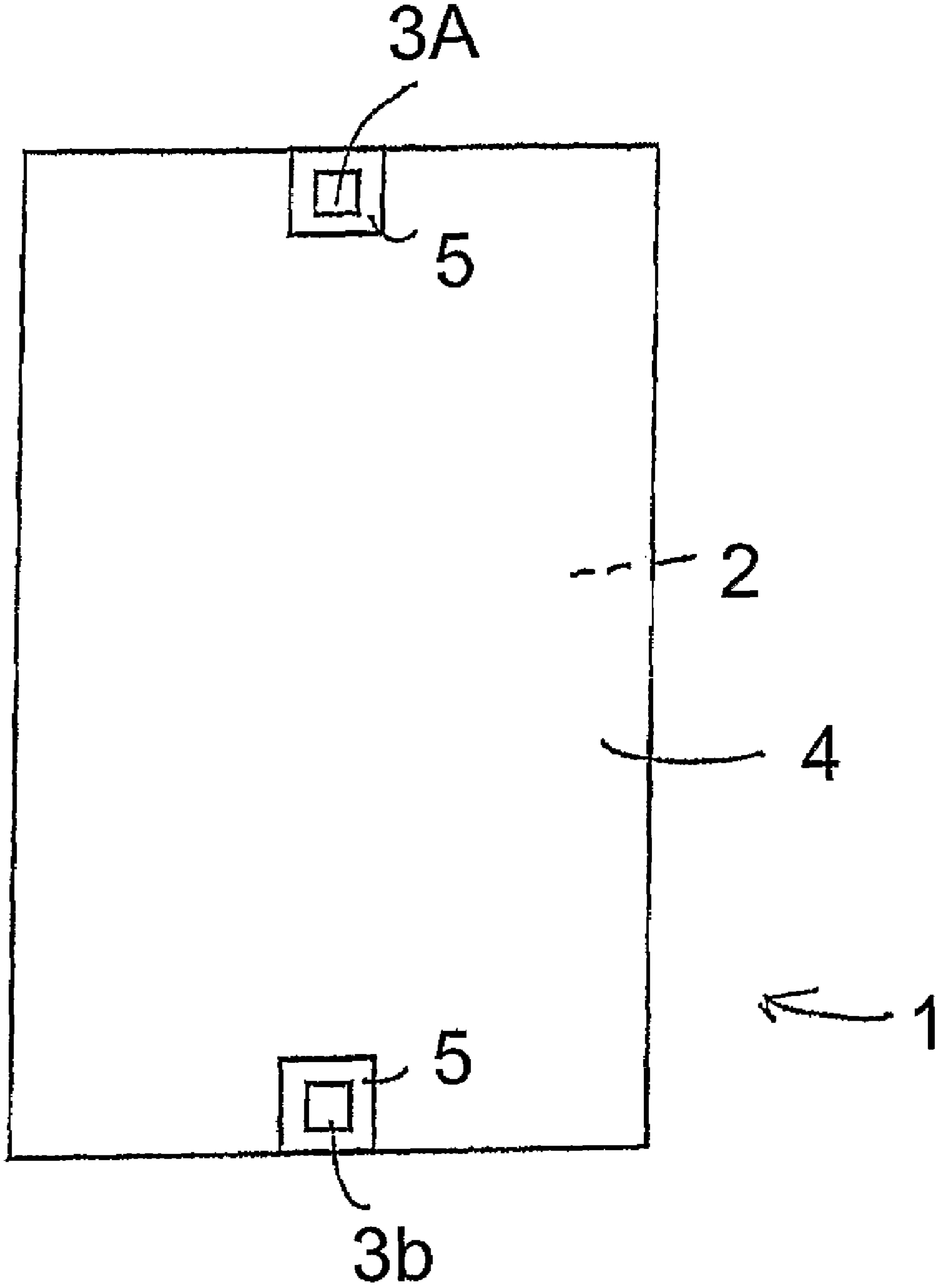
FIG. 6 is a plan view of the upper surface of a voltage tunable dielectric resonator according to another embodiment of the present invention.

FIG. 6 is a plan view showing another embodiment of a voltage tunable dielectric resonator according to the present invention, which includes two metal contacts 3A and 3B positioned at opposite ends of the dielectric base 2. This resonator, in all other respects, is identical to the resonators explained above. Since this resonator has two ports (3A, 3B), however, it can be used as a voltage tunable band pass filter. It can be designed to implement a one pole characteristic, as well as two or more poles by appropriate design of the resonator to support two or more specific resonant modes in conjunction with appropriate coupling coefficients.

All of the resonators described above can be manufactured using standard ceramic and microelectronic fabrication techniques. For example, the dielectric base 2 can be formed as a single green layer of ceramic material and then fired, or as a plurality of green tapes that are laminated and then fired. In both cases, the resulting fired body is a single piece of monolithic ceramic material that exhibits the necessary dielectric properties.

The metal contact 3 and metal ground coating 4 can also be formed using conventional techniques, such as RF sputtering and/or plating. It is preferred that the metal ground coating 4 be formed initially to cover the entire outer surface of the dielectric base 2. The isolation region 5 can then be formed using lithographic techniques to create the metal contact 3.

All of these techniques make the voltage tunable dielectric resonator according to the present invention relatively inexpensive to manufacture. While exemplary methods have been described above, suffice it to say that any conventional microelectronic fabrication method could be used to form the resonators in accordance with the present invention.

While the present invention has been particularly shown and described with reference to the preferred mode as illustrated in the drawings, it will be understood by one skilled in the art that various changes in detail may be effected therein without departing from the spirit and scope of the invention as defined by the claims. For example, and as stated above, while the description pertains mainly to crystalline or ceramic materials, other dielectric materials, such as dielectric glasses and polymers with appropriate voltage dependent characteristics, could be used.

I claim:

1. A discrete voltage tunable resonator comprising:

a dielectric base comprising a dielectric material having at least one of a voltage dependent dielectric constant and piezoelectric characteristics, said base having a width, a length greater than or equal to said width, a thickness and opposed major surfaces;

a metal contact having a predetermined area formed on an outer surface of said dielectric base at a predetermined location to provide a predetermined loaded Q for said resonator; and a metal ground coating formed on the remaining exposed surfaces of said dielectric base with the exception of an isolation region defined around said metal contact, said isolation region having an area sufficient to prevent significant coupling between said metal contact and said metal ground coating;

wherein a control voltage applied between said metal contact and said metal ground coating provides at least one of (i) a variable electric field to control said dielectric constant and a resonant frequency of said resonator and (ii) a piezoelectric response causing a dimensional change in said resonator to control said resonant frequency of said resonator.

2. The discrete voltage tunable resonator of claim 1, wherein said dielectric material comprises at least one of a crystalline material and a ceramic material.

3. The discrete voltage tunable resonator of claim 2, wherein said dielectric material comprises a piezoelectric material.

4. The discrete voltage tunable resonator of claim 2, wherein said dielectric material is one of crystalline quartz, lithium niobate and a material having a strontium titanate composition.

5. The discrete voltage tunable resonator of claim 1, wherein said loaded Q is in a range of 50 to greater than 2000.

6. The discrete voltage tunable resonator of claim 1, wherein said resonant frequency is in the range of 1 GHz to 80 GHz.

7. The discrete voltage tunable resonator of claim 1, wherein said dielectric base consists of a single monolithic piece of fired dielectric ceramic material.

8. The discrete voltage tunable resonator of claim 1, wherein said width and said length of said base are selected such that an electric field intensity within said resonator is greatest proximate a two-dimensional geometric center of said dielectric base at a lowest resonant frequency mode of said resonator, and wherein said metal contact is spaced from said geometric center.

9. The discrete voltage tunable resonator of claim 8, wherein said metal contact is positioned on said one of said opposed major surfaces of said dielectric base proximate one opposed end thereof along said length thereof.

10. The discrete voltage tunable resonator of claim 9, wherein said metal contact is positioned at said one of said opposed ends of said dielectric base.

11. The discrete voltage tunable resonator of claim 9, wherein said dielectric base has a longitudinal centerline extending along said length thereof, and wherein said metal contact is centered on said longitudinal centerline.

12. The discrete voltage tunable resonator of claim 9, wherein said dielectric base has a longitudinal centerline extending along said length thereof, and wherein said metal contact is positioned to one side of said longitudinal centerline.

13. The discrete voltage tunable resonator of claim 1, wherein said metal contact and said metal ground coating are made of a high electrical conductivity metal.

14. The discrete voltage tunable resonator of claim 13, wherein said high electrical conductivity metal is a metal selected from the group consisting of gold, copper and silver.

15. The discrete voltage tunable resonator of claim 13, wherein said metal ground coating comprises a conductive surface finish for solder assembly.

16. The discrete voltage tunable resonator of claim 1, wherein a portion of said metal ground coating is removed to change said resonant frequency.

17. A discrete filter comprising a voltage tunable dielectric resonator, said voltage tunable resonator comprising:

a dielectric base comprising a dielectric material having at least one of a voltage dependent dielectric constant and piezoelectric characteristics, said base having a width, a length greater than or equal to said width, a thickness and opposed major surfaces;

a plurality of metal contacts having a predetermined area formed on an outer surface of said dielectric base at a predetermined location to provide a predetermined loaded Q for said resonator; and a metal ground coating formed on the remaining exposed surfaces of said dielectric base with the exception of an isolation region defined around said metal contacts, said isolation region having an area sufficient to prevent significant coupling between said metal contacts and said metal ground coating;

wherein a control voltage applied between said metal contacts and said metal ground coating provides at least one of (i) a variable electric field to control said dielectric constant and a resonant frequency of said resonator and (ii) a piezoelectric response causing a dimensional change in said resonator to control said resonant frequency of said resonator.

* * * * *